(12) United States Patent
Leng et al.

(10) Patent No.: US 10,833,294 B2
(45) Date of Patent: Nov. 10, 2020

(54) DISPLAY PANEL AND DISPLAY DEVICE

(71) Applicant: Xiamen Tianma Micro-Electronics Co., Ltd, Xiamen (CN)

(72) Inventors: Chuanli Leng, Xiamen (CN); Jialing Li, Xiamen (CN)

(73) Assignee: Xiamen Tianma Micro-Electronics Co., Ltd, Xiamen (CN)

(*) Notice: Subject to any disclaimer, the term of this patent is extended or adjusted under 35 U.S.C. 154(b) by 0 days.

(21) Appl. No.: 16/503,337

(22) Filed: Jul. 3, 2019

(65) Prior Publication Data
US 2020/0212362 A1 Jul. 2, 2020

(30) Foreign Application Priority Data
Dec. 29, 2018 (CN) .......................... 2018 1 1631635

(51) Int. Cl.
| | |
|---|---|
| *H01L 51/52* | (2006.01) |
| *G02F 1/29* | (2006.01) |
| *G09F 9/35* | (2006.01) |
| *H01L 27/32* | (2006.01) |
| *G09F 9/33* | (2006.01) |

(52) U.S. Cl.
CPC ............ *H01L 51/5275* (2013.01); *G02F 1/29* (2013.01); *G09F 9/35* (2013.01); *H01L 27/3244* (2013.01); *H01L 51/5268* (2013.01); *G02F 2203/24* (2013.01); *G09F 9/33* (2013.01)

(58) Field of Classification Search
CPC ............ H01L 51/5275; H01L 51/5268; H01L 27/3244; G02F 1/29; G02F 2203/24; G09F 9/35; G09F 9/33
See application file for complete search history.

(56) References Cited

U.S. PATENT DOCUMENTS

| | | | |
|---|---|---|---|
| 2018/0219174 A1* | 8/2018 | Omata | ............... H01L 51/5253 |
| 2018/0267358 A1* | 9/2018 | Choi | .................... H01L 27/124 |
| 2019/0123306 A1* | 4/2019 | Liang | ................ H01L 51/5275 |
| 2019/0346719 A1* | 11/2019 | Li | ...................... G02F 1/13471 |

FOREIGN PATENT DOCUMENTS

| | | |
|---|---|---|
| CN | 101014899 A | 8/2007 |
| CN | 103413495 A | 11/2013 |
| CN | 107863448 A | 3/2018 |
| CN | 109523913 A | 3/2019 |

OTHER PUBLICATIONS

Chinese First Office Action, dated Jul. 21, 2020, issued in corresponding Chinese Application No. 201811631635.6, filed Dec. 29, 2018, 22 pages.

* cited by examiner

*Primary Examiner* — Julia Slutsker
(74) *Attorney, Agent, or Firm* — Christensen O'Connor Johnson Kindness PLLC

(57) ABSTRACT

The present disclosure relates to the technical field of display technology, and provides a display panel and a display device for increasing a light transmittance and improving a transparent display effect of the display panel. The display panel includes a display layer having a light-transmitting region and a light-emitting region. The display panel also includes a first light adjustment layer disposed on a first surface of the display layer. With respect to light propagating into the display layer via the first surface, at least one portion of the light, which is directed towards the light-emitting region, is redirected by the first light adjustment layer to pass through the light-transmitting region.

20 Claims, 6 Drawing Sheets

DISPLAY PANEL AND DISPLAY DEVICE

CROSS-REFERENCE TO RELATED APPLICATIONS

The present application claims priority to Chinese Patent Application No. 201811631635.6, filed on Dec. 29, 2018, the content of which is incorporated herein by reference in its entirety.

TECHNICAL FIELD

The present disclosure relates to display technology, and more particularly, to a display panel and a display device.

BACKGROUND

With the development of display technology, various new display techniques are constantly emerging. Currently, it is often desirable to provide a transparent display screen in a venue such as an exhibition hall or a showroom. When the transparent display is working, the users on a light-out side of the transparent display can not only see the image displayed on the transparent display screen itself, but also can view the scene at a back side of the transparent display screen through the screen, which greatly enriches the user's visual experience.

However, among the current designs of the transparent display screen, since metal wirings and thin film transistors in the display screen are all made of opaque materials, transmittance of ambient light is insufficient on the back side of the display screen, and thus the display effect of the transparent display screen is negatively affected.

SUMMARY

In view of the above, the present disclosure provides a display panel and a display device, configured to increase the light transmittance of the display panel and improve a transparent display effect of the display panel.

In a first aspect of the present disclosure, a display panel is provided. The display panel includes: a display layer comprising a light-transmitting region and a light-emitting region; and a first light adjustment layer disposed on a first surface of the display layer. With respect to light propagating into display layer via the first surface, at least one portion of the light, which is directed towards the light-emitting region, is redirected by the first light adjustment layer to pass through the light-transmitting region.

In a second aspect of the present disclosure, a display device is provided. The display device includes the display panel according to the first aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Other embodiments are also possible.

DESCRIPTION OF EMBODIMENTS

In order to better understand technical solutions of the present disclosure, the embodiments of the present disclosure are described in details with reference to the drawings.

It should be clear that the described embodiments are merely part of the embodiments of the present disclosure rather than all of the embodiments. Other embodiments obtained by those skilled in the art shall fall into the protection scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be also understood that the terms "first", "second", and the like used to describe convex lens in the embodiments of the present disclosure are not intended to limit these convex lens. These terms are merely used to distinguish convex lenses from one another. For example, without departing from the scope of the embodiments of the present disclosure, a first convex lens may also be referred to as a second convex lens. Similarly, a second convex lens may also be referred to as a first convex lens.

Figure 1:
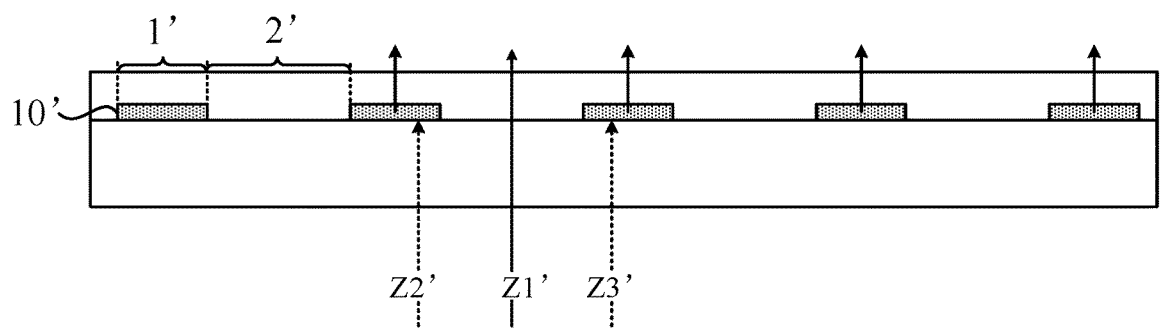
FIG. 1 is a schematic cross-sectional view of a transparent display panel in the related art.

FIG. 1 is a schematic cross-sectional view of a transparent display panel in the related art. The display panel includes a light-emitting region 1' and a light-transmitting region 2'. A sub-pixel 10' for emitting light is provided in the light-emitting region 1'. When the display panel is in operation, light emitted from the sub-pixel 10' exits from the display panel and reaches a user located on a light-out side of the display panel, such that the user can see a display image on the light-out side of the display panel. Further, a portion of ambient light incident on the backlight side of the display panel, such as the light propagating in a direction Z1' shown in FIG. 1, can be transmitted through the light-transmitting region 2' and also reaches the user located on the light-out side of the display panel. However, since the light-emitting region 1' includes a structure formed of opaque materials such as metal wirings and thin film transistors, a large portion of the ambient light incident on the backlight side of the display panel, such as the light propagating in a direction Z2' and a direction Z3' shown in FIG. 1, is blocked by the light-emitting region 1' during a light propagation process, and thus cannot be emitted from the display panel. Thus, the display panel has a relatively low light transmittance, which negatively affects a transparent display effect of the display panel.

Figure 2:
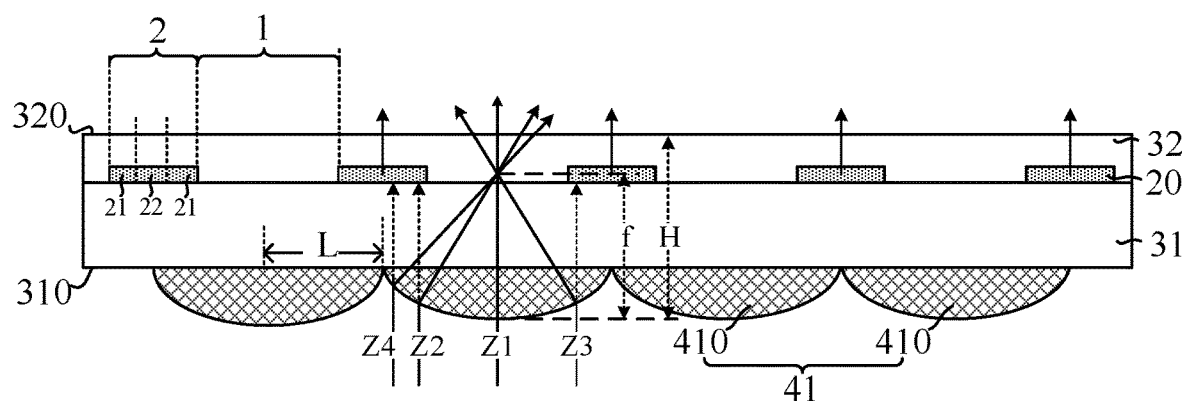
FIG. 2 is a schematic cross-sectional view of a display panel according to an embodiment of the present disclosure.

In this regard, the present disclosure provides a display panel as shown in FIG. 2, which is a schematic cross-sectional view of a display panel according to an embodiment of the present disclosure. The display panel includes a light-transmitting region 1, a light-emitting region 2, and a first light adjustment layer 41 disposed on a first surface 310 of the display panel. With respect to the light propagating into the display panel via the first surface 310, at least one portion of the light passing through the light-emitting region 2 is redirected by the first light adjustment layer 41 to pass through the light-transmitting region 1.

The light-emitting region 2, as a pixel of the display panel, includes a light-emitting element, which can be an organic light-emitting diode or an inorganic light-emitting diode.

When the display panel is in operation, the light emitted by the light-emitting region 2 exits from a second surface 320 of the display panel. In other words, a side where the second surface 320 is located is a light-out side of the display panel, and the light-emitting region 2 is configured to display an image that is supposed to be displayed by the display panel itself. The first surface 310 opposite to the second surface 320 is located on a side referred as to a backlight side of the display panel. In addition, when a portion of light propagating into the display panel via the first surface 310 passes through the light-emitting region 2, such as the light propagating in a direction Z2 and a direction Z3 shown in FIG. 2, the first light adjustment layer 41 can redirect this portion of light in such a manner that the portion of light exits from the display panel through the light-transmitting region 1 and then reaches the user located on the light-out side of the display panel. In this way, the user can see an object disposed on the backlight side of the display panel, i.e., the transparent display of the display panel can be achieved.

As mentioned in the above description of an operating process of the display panel, with respect to the light propagating into the display panel via the first surface 310, at least one portion of the light supposed to propagate through the light-emitting region 2 is redirected by the first light adjustment layer 41 provided on the first surface 310 of the display panel in the embodiment of the present disclosure, so as to pass through the light-transmitting region 1 and exit from the display panel. In this way, an amount of the light blocked by the light-emitting region 2 is reduced, i.e., more light can be emitted from the light-transmitting region 1, such that the light transmittance of the display panel is increased and the transparent display effect of the display panel is improved.

As shown in FIG. 2, the light-emitting region 2 includes a first edge portion 21 and a first center portion 22, and a distance between the first edge portion 21 and the light-transmitting region 1 is smaller than a distance between the first center portion 22 and the light-transmitting region 1. With respect to the light propagating to the first light adjustment layer 41 in a direction perpendicular to the plane of the display panel, light propagating toward the first edge portion 21 is redirected by the first light adjustment layer 41 to a smaller extent than light propagating toward the first center portion 22. For example, with respect to the light propagating along the direction Z2 and the direction Z4, the light propagating along the direction Z2 passes through the first edge portion 21 that has a smaller distance from the light-transmitting region 1, and the light propagating along the direction Z4 passes through the first center portion 22 that has a greater distance from the light-transmitting region 1. In the present embodiment, the light propagating along the direction Z2 is redirected by the first light adjustment layer 41 to a smaller extent than light propagating along the direction Z4. In this way, with respect to the light propagating in the direction perpendicular to the plane of the display panel and toward the light-emitting region 2, even though light propagates a relatively greater distance from the light-transmitting region, it can be redirected by the first light adjustment layer 41 to a greater extent and thus light can be emitted through the light-transmitting region 1. In other words, by the arrangement of the present disclosure, with respect to the light propagating in the direction perpendicular to the plane of the display panel and toward the light-emitting region 2, light still can be redirected to pass through the light-transmitting region 1 to be emitted from the display panel even far from the light-transmitting region 1. Therefore, the amount of the light blocked by the light-emitting region 2 is reduced, and thus the light transmittance of the display panel is increased. It should be noted that, although FIG. 2 merely illustrates the light propagating in the direction perpendicular to the plane of the display panel, the light propagating in other directions also satisfies the redirection manner described above.

The embodiments of the present disclosure provide different designs, in order to redirect the light propagating toward different positions of the light-emitting region 2 by the first light adjustment layer 41 to different extents. Specifically, one design is that the first light adjustment layer 41 has an identical refractive index, but a varying thickness at different positions of the first light adjustment layer 41, such that the light passing through the different positions of the first light adjustment layer 41 is redirected to different extents. The other design is that the first light adjustment layer 41 has a varying refractive index, but an identical thickness at different positions of the first light adjustment layer 41, so as to reach the same effect mentioned above. These two designs will be described in detail as follows.

In the embodiment shown in FIG. 2, the first light adjustment layer 41 has an identical refractive index, but a varying thickness at different positions of the first light adjustment layer 41. In this embodiment, the first light adjustment layer 41 overlaps the light-emitting region 2 and the light-transmitting region 1, and a portion of the first light adjustment layer 41 overlapping the light-emitting region 2 has the same refractive index as a portion of the first light adjustment layer 41 overlapping the light-transmitting region 1. In addition, the thickness of the first light adjustment layer 41 decreases with the increase in its distance from a center of the light-transmitting region 1. It should be understood that the thickness of the first light adjustment layer 41 is a thickness in the direction perpendicular to the display panel.

In this embodiment, since the first light adjustment layer 41 overlaps the light-emitting region 2, the light supposed to pass through the light-emitting region 2 in the direction perpendicular to the plane of the display panel can be redirected by the first light adjustment layer 41, so as to be emitted from the light-transmitting region 1. In this way, the light transmittance of the display panel can be increased. In addition, under condition of the identical refractive index at any point of the first light adjustment layer 41, the light entering the first light adjustment layer 41 propagates toward a portion of the first light adjustment layer 41 having a relatively greater thickness. Therefore, in the present embodiment, the thickness of the first light adjustment layer 41 is set to decrease with the increase in its distance from the center of the light-transmitting region 1. In other words, the first light adjustment layer 41 has the greatest thickness at a position closest to the center of the light-transmitting region 1, so that light entering the first light adjustment layer 41 propagates toward the center of the light-transmitting region 1, thereby further increasing the light transmittance of the display panel.

On basis of the thickness of the first light adjustment layer 41 decreasing with the increase in its distance from a center of the light-transmitting region 1, as shown in FIG. 2, the thickness of the first light adjustment layer 41 can be set in such manner that a change rate of the thickness increases with the increase in its distance from the center of the light-transmitting region 1. In other words, the change rate of the thickness is varying at different positions of the first light adjustment layer 41, such that the first light adjustment layer 41 has an arc edge as shown in FIG. 2.

If the edge of the first light adjustment layer 41 is a straight line, an incident angle of a normally incident ambient light beam are the same on each position on the first light adjustment layer 41. Since the ambient light is a composite light including red, green and blue light that have different wavelengths and refractive indices, light having different colors included in each light beam undergoes different degrees of refraction after being incident into the first light adjustment layer 41. Regarding the refraction on different positions of the first light adjustment layer 41, since the light beams have the same incident angle, the light having a certain color included in each light beam has a same refraction angle along different positions of the first light adjustment layer 41, thereby leading to a dispersion phenomenon. In contrast, the first light adjustment layer 41 according to the present disclosure has a shape shown in FIG. 2, such that the incident angle of a light beam normally incident on the first light adjustment layer 41 is different on each position on the first light adjustment layer 41. Correspondingly, with respect to the refraction on different positions of the first light adjustment layer 41, since the light beams have different incident angles, the light having a certain color included in each light beam has different refraction angles on different positions of the first light adjustment layer 41. In this way, several different colors of light may propagate in one direction, and are mixed to form white light, thereby avoiding the dispersion phenomenon. Therefore, in the present embodiment, by increasing the change rate of the thickness of the first light adjustment layer 41 with the increase in its distance from the center of the light-transmitting region 1, the dispersion phenomenon can be avoided and the display effect is guaranteed, while the light transmittance of the display panel can be increased.

Further referring to FIG. 2, the above first light adjustment layer 41 includes a first convex lens 410, and the first convex lens 410 has a main optical axis passing through the light-transmitting region 1. By such arrangement, the light propagating to the first convex lens 410 in the direction perpendicular to the plane of the display panel, after passing through the first convex lens 410, propagates toward the main optical axis in the light-transmitting region 1. In this way, the amount of light emitted from the light-transmitting region 1 can be increased, thereby increasing the light transmittance of the display panel.

Figure 3:
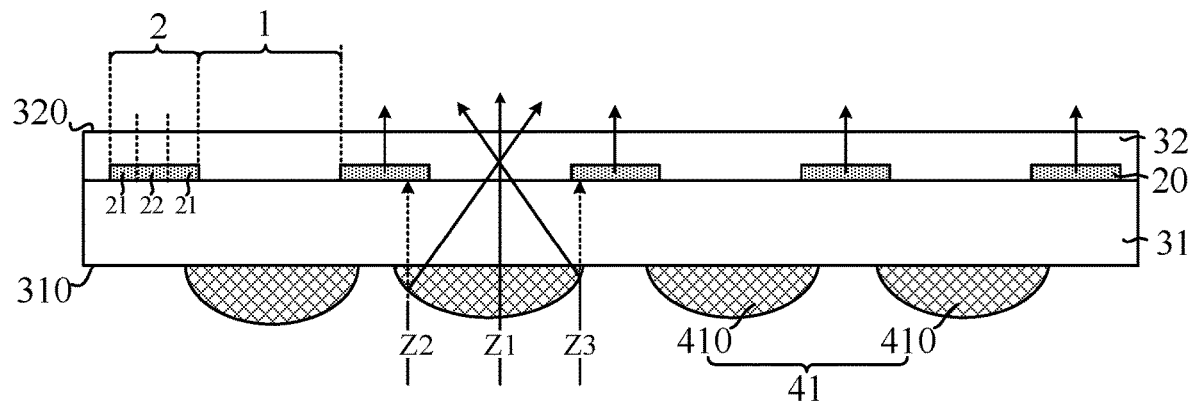
FIG. 3 is a schematic cross-sectional view of a display panel according to another embodiment of the present disclosure.

It should be understood that, the position relationship of two adjacent first convex lenses 410 is illustrative in FIG. 2. In practice, two adjacent first convex lenses 410 also can be not connected with each other as shown in FIG. 3, which is a schematic cross-sectional view of a display panel according to another embodiment. It is also possible that some of the first convex lenses 410 are connected with one another, while the others are not. The position relationships of the first convex lenses 410 are not specifically limited in the present disclosure.

Figure 4:
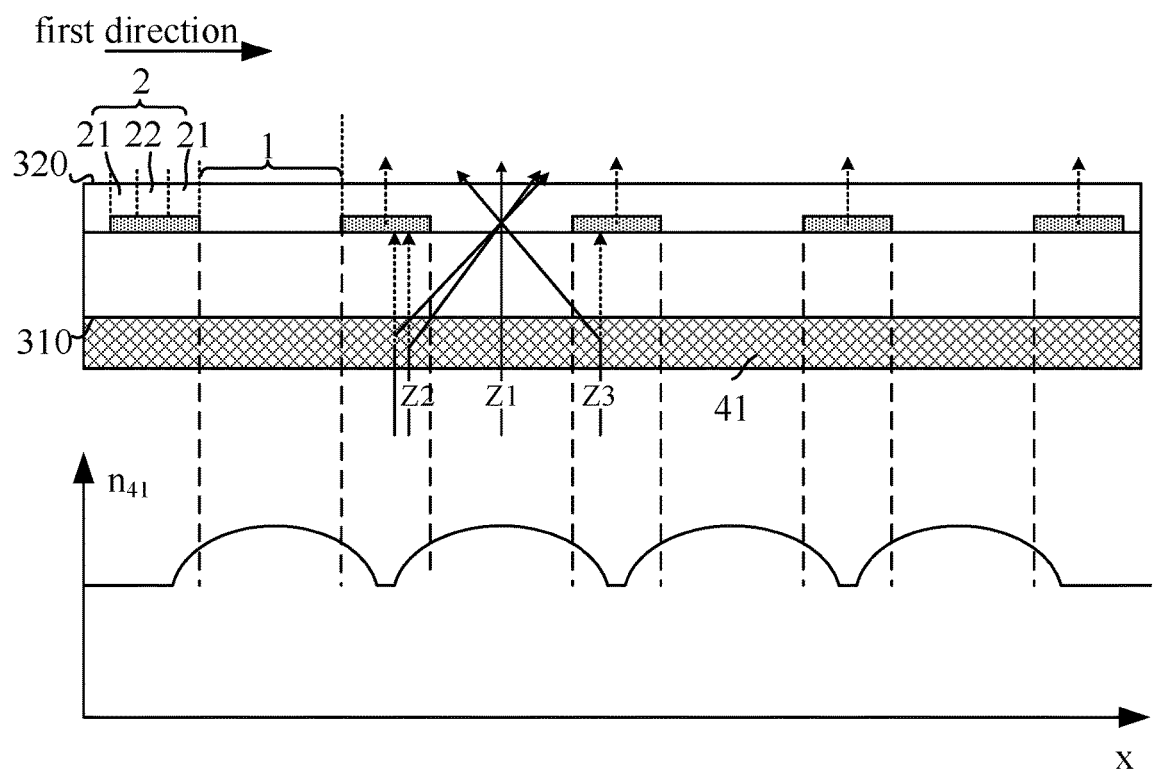
FIG. 4 is a schematic cross-sectional view of another display panel according to an embodiment of the present disclosure, and a graph of a change in a refractive index of a first light-adjustment layer in the display panel.

In another embodiment, the first light adjustment layer 41 has an identical thickness, but a varying refractive index at different positions of the first light adjustment layer 41, as shown in FIG. 4. FIG. 4 is a schematic cross-sectional view of another display panel according to an embodiment of the present disclosure, and a graph of a change in a refractive index of a first light-adjustment layer in the display panel. The cross-sectional view of the display panel is shown in the upper part of FIG. 4. In the graph of the change in a refractive index of the first light-adjustment layer 41 shown in the lower part of FIG. 4, the horizontal axis x represents a distance between each position of the first light adjustment layer shown in the upper part of FIG. 4 and the leftmost end of the first light adjustment layer in a first direction, and the vertical axis $n_{41}$ represents the refractive index of the first light adjustment layer. The first direction can be any direction passing through the light-emitting region 2 and the light-transmitting region 1 on the plane of the display panel. The first light adjustment layer 41 overlaps the light-emitting region 2 and the light-transmitting region 1, and a portion of the first light adjustment layer 41 overlapping the light-emitting region 2 has an identical thickness as a portion of the first light adjustment layer 41 overlapping the light-transmitting region 1. In addition, the refractive index of the first light adjustment layer 41 decreases with the increase in its distance from the center of the light-transmitting region 1.

In this embodiment, since the first light adjustment layer 41 overlaps the light-emitting region 2, the light supposed to pass through the light-emitting region 2 in the direction perpendicular to the plane of the display panel is redirected by the first light adjustment layer 41, so as to be emitted from light-transmitting region 1. In this way, the light transmittance of the display panel is increased. Since the light is always deflected toward a medium have a greater refractive index, the first light adjustment layer 41 in the embodiment of the present disclosure is set to overlap both the light-emitting region 2 and the light-transmitting region 1. In addition, under condition of the identical thickness at any point of the first light adjustment layer 41, the refractive index of the first light adjustment layer 41 is set to decrease with the increase in its distance from the center of the light-transmitting region 1. In other words, the first light adjustment layer 41 has the greatest refractive index at a position closest to the center of the light-transmitting region 1. In this way, with respect to the light propagating to the light-emitting region 2 in the direction perpendicular to the plane of the display panel, the light entering the first light adjustment layer 41 will propagate toward the center of the light-transmitting region 1, thereby further increasing the light transmittance of the display panel.

As shown in FIG. 4, since a change rate of the refractive index of the first light adjustment layer 41 increases with the increase in its distance from the center of the light-transmitting region 1, the first light adjustment layer 41 can achieve the same effect as the first convex lens 410 shown in FIG. 2. Therefore, the dispersion phenomenon can be avoided and the display effect is improved, while the light transmittance of the display panel can be increased.

Figure 5:
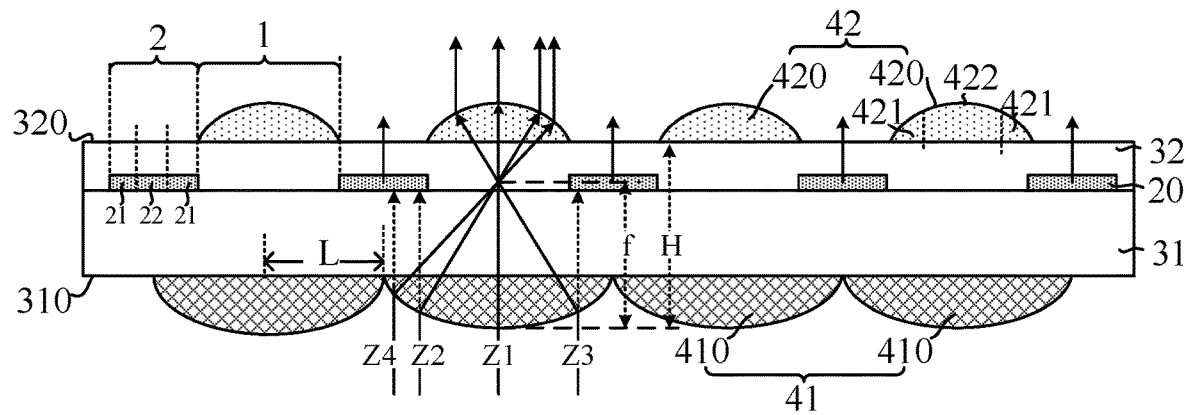
FIG. 5 is a schematic cross-sectional view of a display panel according to yet another embodiment of the present disclosure.

FIG. 5 is a schematic cross-sectional view of a display panel according to yet another embodiment of the present disclosure. In this embodiment, the display panel further includes a first substrate 31 and a second substrate 32 that are opposite to each other. The light-emitting region 2 includes a plurality of sub-pixels 20 disposed on a side of the first substrate 31 facing towards the second substrate 32. Thus, light can be emitted from a position corresponding to the sub-pixel 20 in a direction indicated by the arrows above the sub-pixels 20 shown in FIG. 2. The light-transmitting region 1 is located between two adjacent sub-pixels 20. The first surface 310 is a side of the first substrate 31 facing away from the second substrate 32. That is, the first light adjustment layer 41 is disposed on the side of the first substrate 31 facing away from the second substrate 32. As shown in FIG. 5, the display panel further includes a second light adjustment layer 42 disposed on a side of the second substrate 32 facing away from the first substrate 31, and light passing through the second light adjustment layer 42 is parallel light or scattered light. The scattered light means that the light emitted from the second light-modulating layer 42 has a plurality of propagating directions. Specifically, the scattered light having a plurality of propagating directions includes light passing through different positions of a display area in the display panel, including the light-emitting region 2 and the light-transmitting region 1. In addition, the light in different propagating directions has a substantially uniform intensity. That is, the light would not be concentrated in a certain propagating direction or sparse in other propagating directions.

In this embodiment, by providing the second light adjustment layer 42 on the side of the second substrate 32 facing away from the first substrate 31, the light beams are changed into parallel light or scattered light after passing through the first light adjustment layer 41, which makes the light at respective positions of the display panel more uniform, thereby improving the uniformity of the brightness of the display panel and improving the transparent display effect of the display panel.

Figure 6:
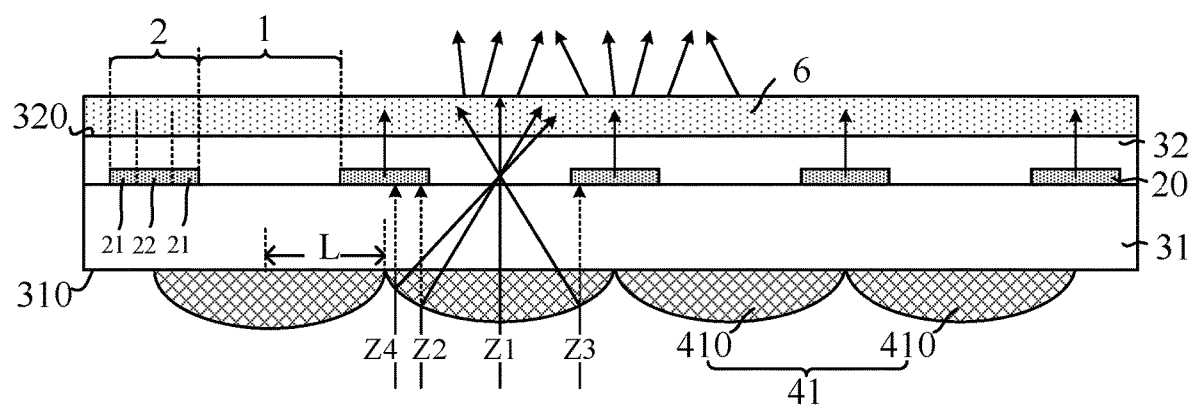
FIG. 6 is a schematic cross-sectional view of a display panel according to yet another embodiment of the present disclosure.

FIG. 6 is a schematic cross-sectional view of a display panel according to yet another embodiment of the present disclosure. Specifically, the second light adjustment layer 42 can be disposed to cover a scattering layer 6 of the second substrate 32, so that the light scatters to a certain extent after passing through the first light adjustment layer 41 and then a scattering layer 6, so as to improve uniformity of light emitted from the display panel in all directions.

For example, as shown in FIG. 5, the second light adjustment layer 42 includes a second edge portion 421 and a second center portion 422. A distance between the second edge portion 421 and the center of the light-transmitting region 1 is greater than a distance between the second center portion 422 and the center of the light-transmitting region 1. The light passing through the second edge portion 421 of the second light adjustment layer 42 is redirected by the second light adjustment layer 42 to a greater extent than light passing through the second center portion 422 of the second light adjustment layer 42.

With respect to the light propagating along the direction Z2 and the direction Z4 shown in FIG. 5, the light propagating along the direction Z4, when arriving the second light adjustment layer 42 after passing through the first light adjustment layer 41, propagates in a direction facing away from the center of the light-transmitting region 1, i.e., the light propagating along the direction Z4 is emitted toward the second edge portion 421 of the second light adjustment layer 42 after passing through the first light adjustment layer 41. Similarly, the light propagating along the direction Z2 is redirected by the first light adjustment layer 41 to propagate toward the center of the light-transmitting region 1, i.e., the light propagating along the direction Z2 is emitted toward the second center portion 422 of the second light adjustment layer 42 after passing through the first light adjustment layer 41. Therefore, with respect to the light supposed to pass through the light-emitting region 2 in a direction perpendicular to the plane of the display panel, the light can be emitted from the second light adjustment layer 42 as parallel or scattered light even though the light propagates in a direction away from the center of the light-transmitting region 1 after being emitted from the first light adjustment layer 41. As the light passing through the second center portion 422 of the second light adjustment layer 42 is redirected by the second light adjustment layer 42 to a smaller extent than light passing through the second edge portion 421 of the second light adjustment layer 42 according to the present embodiment. In this way, the light emitted from the display panel is more uniform at respective positions, and thus the uniformity of brightness throughout the display panel is enhanced, thereby improving the transparent display effect of the display panel.

For example, when the first light adjustment layer 41 is embodied as the first convex lens 410, the first convex lens 410 can converge the light directed thereto. If the first convex lens 410 and the first substrate 31 have the same refractive index n, a distance f between a light convergence point and a position on a surface of the first convex lens 410 farthest from the first substrate 31 satisfies:

$$f = \frac{nr}{n-1}, \qquad (1)$$

where r is a spherical radius of the first convex lens 410.

In a case that the first convex lens 410 and the first substrate 31 have different refractive indices, the first convex lens 410 has a refractive index $n_1$, the first substrate 31 has a dielectric constant $n_{glass}$, and the distance f between the light convergence point and the position on the surface of the first convex lens 410 farthest from the first substrate 31 satisfies:

$$f = \frac{L}{\sin\left(\arctan\left(\frac{L}{\frac{r}{\tan\left(\arcsin\frac{n_1-1}{n_{glass}}\right)} - T_1}\right)\right)}, \qquad (2)$$

where $T1=r-\sqrt{r^2-L^2}$, and L is a half of a width of a projection of the first convex lens 410 on the plane of the first substrate 31, as shown in FIG. 5.

Figure 8:
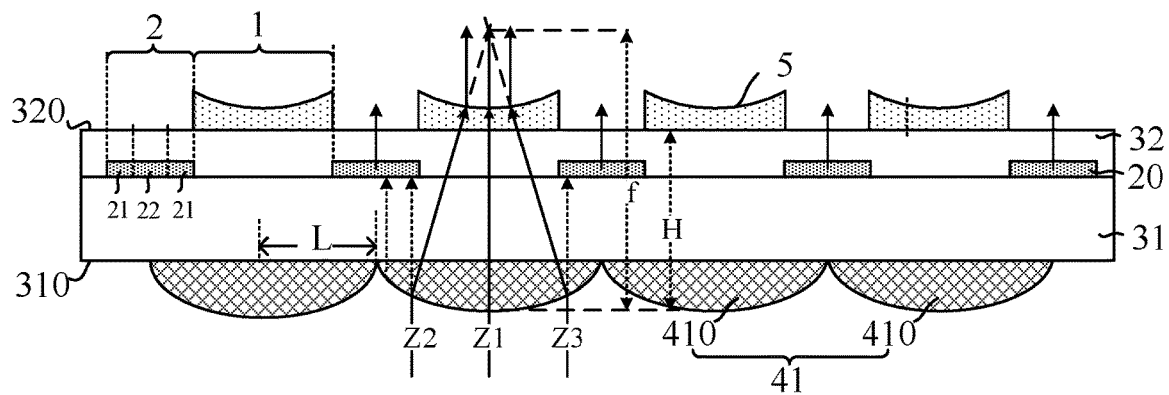
FIG. 8 is a schematic cross-sectional view of a display panel according to yet another embodiment of the present disclosure.

In the actual design of the display panel, the distance f between the light convergence point and the position on the surface of the first convex lens 410 farthest from the first substrate 31 can be calculated according to the above formula (1) or formula (2). The calculated distance f is compared with a sum H of thicknesses of the first convex lens 410, the first substrate 31 and the second substrate 32, where a sum of the thicknesses of the first substrate 31 and the second substrate 32 means a distance between the first surface 310 and the second surface 320. In a case of f<H, as shown in FIG. 5, the light convergence point is located between the first surface 310 and the second surface 320, and thus the second light adjustment layer 42 is required to converge the light directed thereto. In a case of f>H, as shown in FIG. 8, which is a schematic cross-sectional view of a display panel according to yet another embodiment of the present disclosure, the light convergence point is located on a side of the second surface 320 facing away from the first surface 310, and thus the second light adjustment layer 42 is required to scatter the light directed thereto. These two cases will be described separately below.

In the case of f<H, as shown in FIG. 5, the light propagating in the direction perpendicular to the plane of the display panel is converged at a point between the first substrate 31 and the second substrate 32 after being emitted from the first light adjustment layer 41, and then the light is directed to second light adjustment layer 42 as scattered light. In this case, the second light adjustment layer 42 provided in the embodiment of the present disclosure can change the light emitted from the second light adjustment layer 42 to a more converged form than the light entering the second light adjustment layer 42, by for example, changing the light emitted from the second light adjustment layer 42 to parallel light.

In order to enable the second light adjustment layer 42 to redirect the light passing through the second edge portion 421 to a different extent from the light passing through the second center portion 422, the embodiments of the present disclosure provide two designs of the second light adjustment layer 42 similar as the designs of the first light adjustment layer 41. Specifically, one design is that the second light adjustment layer 42 has an identical refractive index, but a varying thickness at different positions of the second light adjustment layer 42, while the other one is that the second light adjustment layer 42 has a varying refractive index, but an identical thickness at different positions of the second light adjustment layer 42, aiming to achieve the above purposes. These designs will be described separately below.

For example, in a case that the first light adjustment layer 41 is embodied as the first convex lens 410, as shown in FIG. 5, when the second light adjustment layer 42 has an identical refractive index, but a varying thickness at different positions of second light adjustment layer 42, the thickness of the second light adjustment layer 42 decreases with the increase in its distance from the center of the light-transmitting region 1. In other words, the second light adjustment layer 42 has the greatest thickness at a position closest to the center of the light-transmitting region 1, so that light incident into the second light adjustment layer 42 propagates towards the center of the light-transmitting region 1. Thereby, light emitted from the second light adjustment layer 42 is in the more converged state than light entering the second light adjustment layer 42. It should be understood that the thickness of the second light adjustment layer 42 is a thickness in the direction perpendicular to the display panel.

On basis of setting the thickness of the second light adjustment layer 42 to decrease with the increase in its distance from the center of the light-transmitting region 1, as shown in FIG. 5, the thickness of the second light adjustment layer 42 can be set in such manner that a change rate of the thickness increases with the increase in its distance from the center of the light-transmitting region 1. In other words, the change rate of the thickness is varying at respective positions of the second light adjustment layer 42, such that the second light adjustment layer 42 has an arc edge as shown in FIG. 5. In this way, the dispersion phenomenon can be avoided and the display effect is guaranteed, while the uniformity of light on respective positions of the display panel can be increased.

Additionally, the second light adjustment layer 42 can be disposed to not overlap the light-emitting region 2, such that the second light adjustment layer 42 will not affect the normal light emission of the light-emitting region 2.

Therefore, as shown in FIG. 5, the above second light adjustment layer 42 can be embodied as a second convex lens 420. The second convex lens 420 is configured to converge the light directed thereto into parallel light. In addition, the second convex lens 420 can be disposed to not overlap the light-emitting region 2, and a projection of the first convex lens 410 on the plane of the display panel covers a projection of the second convex lens 420 on the plane of the display panel.

According to the embodiment of the present disclosure, a projection of the first convex lens 410 on the plane of the display panel covers a projection of the second convex lens 420 on the plane of the display panel, i.e., the first convex lens 410 has a relatively larger area, so that more light can be redirected by the first convex lens 410 to be emitted from the light-transmitting region 1. In this way, the transmittance of the ambient light and the display effect of the display panel can be improved. Further, since the second convex lens 420 does not overlap the light-emitting region 2, the second convex lens 420 will not affect the normal light emission of the sub-pixel 2 in the light-emitting region 2. In this way, the transparent display effect of the display panel is improved, and the uniformity on different positions of the display panel is guaranteed without degrading the display image of the display panel.

Figure 7:
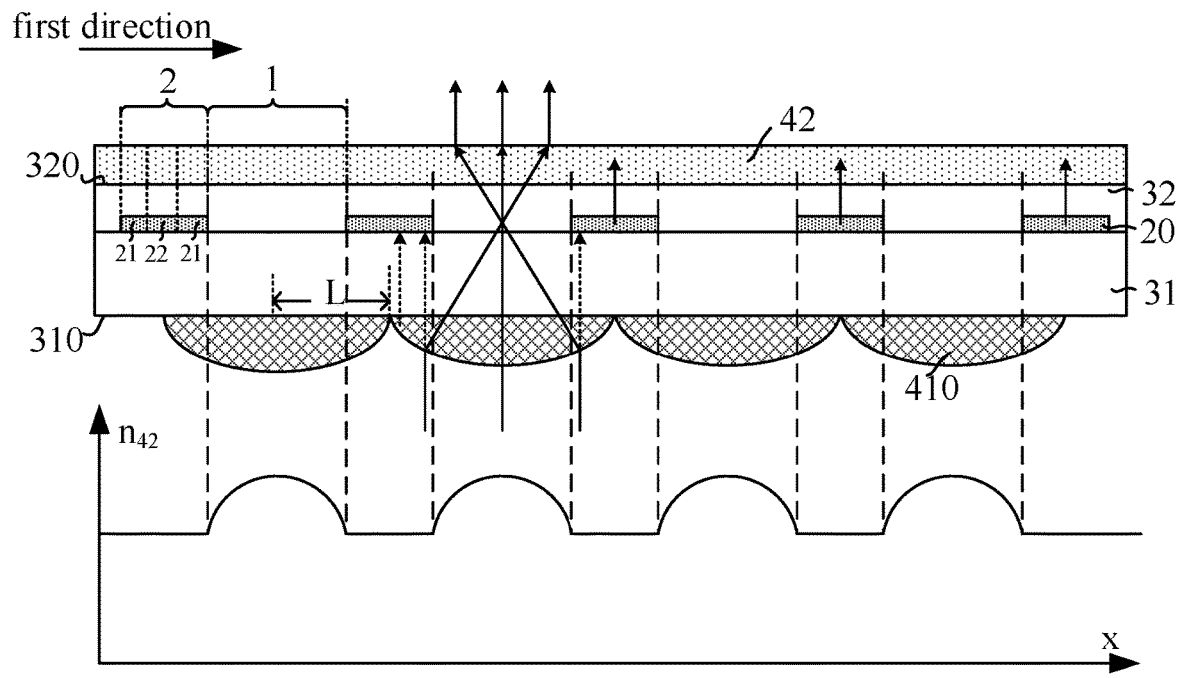
FIG. 7 is a schematic cross-sectional view of a display panel according to another embodiment of the present disclosure, and a graph of a change in a refractive index of a second light-adjustment layer in the display panel.

In order to converge the light directed to the second convex lens 420 to parallel light, another display panel is shown in FIG. 7. FIG. 7 is a schematic cross-sectional view of a display panel according to another embodiment of the present disclosure, and a graph of a change in a refractive index of a second light-adjustment layer in the display panel. The cross-sectional view of a part of the display panel is shown in the upper part of FIG. 7. In the graph of the change in a refractive index of the first light-adjustment layer shown in the lower part of FIG. 7, the horizontal axis x represents a distance between each position of the second light adjustment layer shown in the upper part of FIG. 7 and the leftmost end of the second light adjustment layer in a first direction, and the vertical axis $n_{42}$ represents the refractive index of the second light adjustment layer. In this case, the second light adjustment layer 42 can have the same thickness at different positions of the second light adjustment layer 42, and the refractive index $n_{42}$ of the second light adjustment layer 42 decreases with the increase in its distance from the center of the light-transmitting region 1. Further, a change rate of the refractive index $n_{42}$ of the second light adjustment layer 42 increases with the increase in its distance from the center of the light-transmitting region 1, such that the second light adjustment layer 42 can achieve the same effect as the second convex lens 420.

In the case of f>H, i.e., the parallel light propagating in the direction perpendicular to the plane of the display panel converges at a point on a side of the second substrate 32 facing away from the first substrate 31 after passing through the first light adjustment layer 41, the light is in a converged state when entering the second light adjustment layer 42. In this case, the second light adjustment layer 42 is configured in such manner that the light emitted from the second light adjustment layer 42 is in a scattered state compared with the light entering the second light adjustment layer 42. That is, the light emitted from the second light adjustment layer 42 is changed to be parallel light.

The embodiments of the present disclosure provide two designs of the second light adjustment layer 42. Specifically, one design is that the second light adjustment layer 42 has an identical refractive index, but a varying thickness at different positions of the second light adjustment layer 42, while the other one is that the second light adjustment layer 42 has a varying refractive index, but an identical thickness at different positions of the second light adjustment layer 42. These designs will be described separately below.

Further taking the first light adjustment layer 41 embodied as the first convex lens 410 as an example, as shown in FIG. 8, when the second light adjustment layer 42 has an identical refractive index, but a varying thickness at different positions of second light adjustment layer 42, the thickness of the second light adjustment layer 42 increases with the increase in its distance from a center of the light-transmitting region 1. In other words, the second light adjustment layer 42 has the smallest thickness at a position closest to the center of the light-transmitting region 1, so that light emitted from the second light adjustment layer 42 propagates in a direction away from the center of the light-transmitting region 1. In this way, the light emitted from the second light adjustment layer 42 is more scattered than the light entering the second light adjustment layer 42.

In addition to the thickness of the second light adjustment layer 42 increasing with the increase in its distance from the center of the light-transmitting region 1, as shown in FIG. 8, a change rate of the thickness of the second light adjustment layer 42 also increases with the increase in its distance from the center of the light-transmitting region 1. In other words, since the change rate of the thickness of the second light adjustment layer 42 is varying, the second light adjustment layer 42 has an arc edge as shown in FIG. 8. In this way, the dispersion phenomenon can be avoided and the display effect is guaranteed, while the uniformity at different positions of the display panel is guaranteed.

In addition, the second light adjustment layer 42 can be disposed to not overlap the light-emitting region 2, such that the second light adjustment layer 42 will not affect the normal light emission of the light-emitting region 2.

On basis of the above, as shown in FIG. 8, the above second light adjustment layer 42 can be embodied as a concave lens 5. The light emitted from the concave lens 5 is in a more scattered state than the light entering the concave lens 5. The concave lens 5 does not overlap the light-emitting region 2, and the projection of the first convex lens 410 on the plane of the display panel covers a projection of the concave lens 5 on the plane of the display panel.

According to the present disclosure, the projection of the first convex lens 410 on the plane of the display panel covers a projection of the concave lens 5 on the plane of the display panel, i.e., the first convex lens 410 has a relatively larger area, so that more light can be redirected by the first convex lens 410 to be emitted from the light-transmitting region 1. In this way, the transmittance of the ambient light and the display effect of the display panel can be improved. Further, since the concave lens 5 does not overlap the light-emitting region 2, the concave lens 5 will not affect the normal light emission of the sub-pixel 2 in the light-emitting region 2. In this way, the transparent display effect of the display panel is improved, and the uniformity on different positions of the display panel is improved, without degrading the display image of the display panel.

Figure 9:
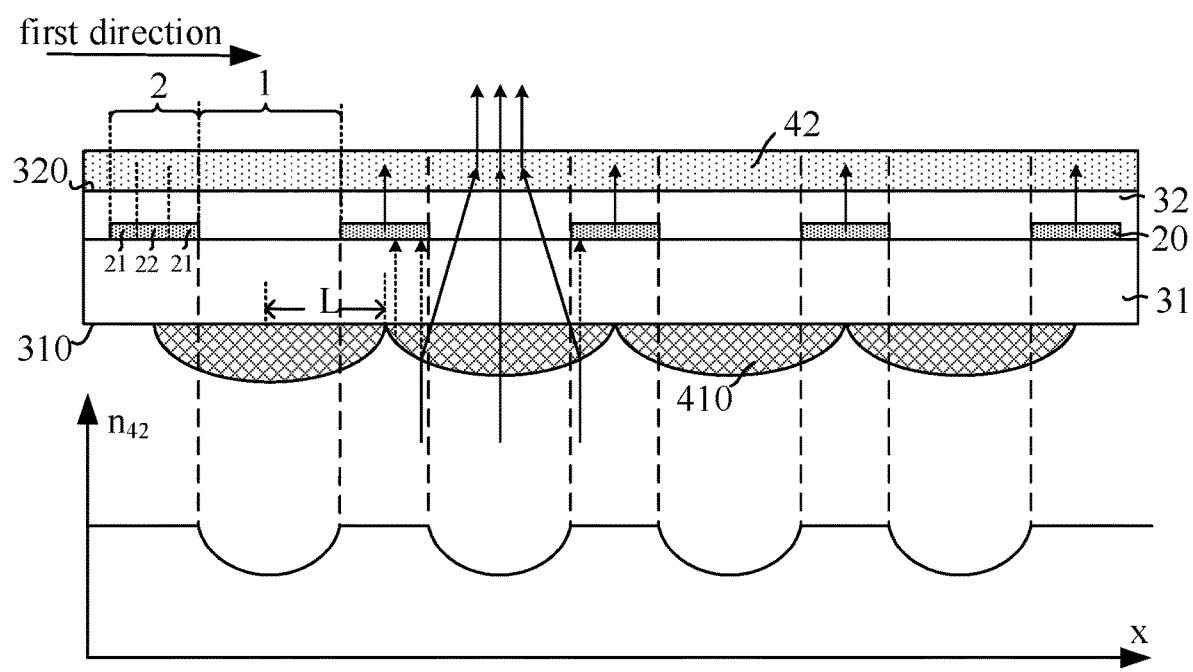
FIG. 9 is a schematic cross-sectional view of a display panel according to another embodiment of the present disclosure, and a graph of a change in a refractive index of a second light-adjustment layer in the display panel.

The parallel light propagating in the direction perpendicular to the plane of the display panel converges at a point on a side of the second substrate 32 facing away from the first substrate 31 after passing through the first light adjustment layer 41, as shown in FIG. 9. FIG. 9 is a schematic cross-sectional view of a display panel according to another embodiment of the present disclosure, and a graph of a change in refractive index of a second light-adjustment layer in the display panel. The cross-sectional view of a part of the display panel is shown in the upper part of FIG. 9. In the graph of the change in refractive index of the second light-adjustment layer shown in the lower part of FIG. 9, the horizontal axis x represents a distance between each position of the second light adjustment layer shown in the upper part of FIG. 9 and the leftmost end of the second light adjustment layer in a first direction, and the vertical axis $n_{42}$ represents the refractive index of the second light adjustment layer. In this case, the second light adjustment layer 42 can have a same thickness at different positions of the second light adjustment layer 42, and the refractive index $n_{42}$ of the second light adjustment layer 42 increases with the increase in its distance from the center of the light-transmitting region 1 closest thereto. Further, the change rate of the refractive index $n_{42}$ of the second light adjustment layer 42 increases with the increase in its distance from the center of the light-transmitting region 1, such that the second light adjustment layer 42 can achieve the same effect as the concave lens 5.

It should be understood that the first light adjustment layer 41 in FIGS. 5 to 9 can be set as involving the structure as shown in FIG. 4, which is not specifically limited in the present disclosure.

When the first light adjustment layer 41 and/or the second light adjustment layer 42 has a same thickness, but a varying refractive index at different positions thereof, the first light adjustment layer 41 and/or the second light adjustment layer 42 can be made of a liquid crystal material, and different voltages are applied to liquid crystals at different positions, such that the refractive index at different positions can satisfy the conditions described above.

In another embodiment, the first light adjustment layer 41 and/or the second light adjustment layer 42 can be made of a ferroelectric material, and different voltages are applied at different positions thereof, such that the refractive index at different positions can satisfy the above conditions.

Figure 10:
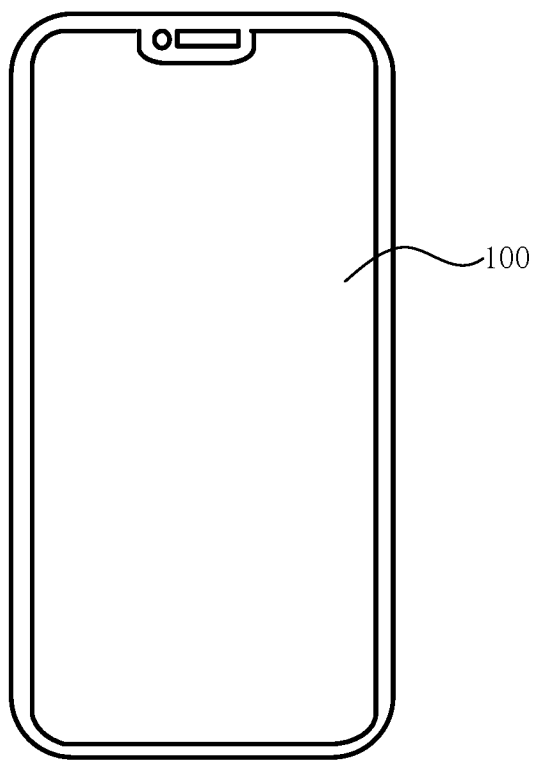
FIG. 10 is a structural schematic diagram of a display device according an embodiment of the present disclosure.

The embodiments of the present disclosure further provide a display device. FIG. 10 is a schematic diagram of a display device according to an embodiment of the present disclosure. In this embodiment, the display device includes the display panel 100 mentioned above. The specific structure of the display panel 100 has been described in detail in the above embodiments, and will not be repeated herein. It should be understood that the display device shown in FIG. 10 is merely illustrative, and the display device can be any electronic device having a transparent display function, such as a show window, smart glasses, a car display, a mobile phone, a tablet computer, a notebook computer, or the like.

In the display device provided by the embodiments of the present disclosure, a first light adjustment layer is provided on the first surface of the display panel. In this regard, with respect to the light propagating into the display panel via the first surface, at least one portion of the light supposed to propagate through the light-emitting region is redirected by the first light adjustment layer, so as to pass through the light-transmitting region and exit from the display panel. Thus, an amount of the light blocked by the light-emitting region is reduced, i.e., more light can be emitted from the light-transmitting region, such that the light transmittance of the display panel is increased and the transparent display effect of the display panel is improved.

The embodiments described above are some preferable embodiments of the present disclosure, and not intended to limit the present disclosure. Any modifications, equivalent substitutions or improvements made based on the spirit and principles of the present application shall fall within the protection scope of the present disclosure.

What is claimed is:

1. A display panel, comprising:
a display layer comprising a light-transmitting region and a light-emitting region;
and
a first light adjustment layer disposed on a first surface of the display layer,
wherein the light-emitting region comprises a first edge portion and a first center portion, wherein a distance between the first edge portion and the light-transmitting region is smaller than a distance between the first center portion and the light-transmitting region,
wherein the first light adjustment layer overlaps the light-emitting region and the light-transmitting region, a portion of the first light adjustment layer overlapping the light-emitting region and a portion of the first light adjustment layer overlapping the light-transmitting region have an identical refractive index, and a thickness of the first light adjustment layer decreases with an increase in its distance from a center of the light-transmitting region, so that with respect to light propagating into the display layer via the first surface, at least one portion of the light, which is directed towards the light-emitting region, is redirected by the first light adjustment layer to pass through the light-transmitting region; and with respect to light propagating to the first light adjustment layer in a direction perpendicular to a plane of the display panel, a portion of the light propagating toward the first edge portion is redirected by the first light adjustment layer to a smaller extent than a portion of the light propagating toward the first center portion,
wherein the thickness of the first light adjustment layer is a thickness in a direction perpendicular to the display panel.

2. The display panel according to claim 1, wherein a change rate of the thickness of the first light adjustment layer increases with the increase in its distance from the center of the light-transmitting region.

3. The display panel according to claim 2, wherein the first light adjustment layer comprises a first convex lens, and the first convex lens has a main optical axis passing through the light-transmitting region.

4. A display panel comprising:
a display layer comprising a light-transmitting region and a light-emitting region;
and
a first light adjustment layer disposed on a first surface of the display layer,
wherein the light-emitting region comprises a first edge portion and a first center portion, wherein a distance between the first edge portion and the light-transmitting region is smaller than a distance between the first center portion and the light-transmitting region,
wherein the first light adjustment layer overlaps the light-emitting region and the light-transmitting region,
a portion of the first light adjustment layer overlapping the light-emitting region and a portion of the first light adjustment layer overlapping the light-transmitting region have an identical thickness, and
the first light adjustment layer has a refractive index decreasing with an increase in its distance from a center of the light-transmitting region so that with respect to light propagating into the display layer via the first surface, at least one portion of the light, which is directed towards the light-emitting region, is redirected by the first light adjustment layer to pass through the light-transmitting region; and with respect to light propagating to the first light adjustment layer in a direction perpendicular to a plane of the display panel, a portion of the light propagating toward the first edge portion is redirected by the first light adjustment layer to a smaller extent than a portion of the light propagating toward the first center portion.

5. The display panel according to claim 4, wherein a change rate of the refractive index of the first light adjustment layer increases with the increase of its distance from the center of the light-transmitting region.

6. The display panel according to claim 1,
wherein the display layer further comprises: a first substrate; and a second substrate opposite to the first substrate,
wherein the light-emitting region comprises a plurality of sub-pixels disposed on a side of the first substrate facing the second substrate, the light-transmitting region is located between two adjacent sub-pixels of the plurality of sub-pixels, and the first light adjustment layer is disposed on a side of the first substrate facing away from the second substrate,
wherein the display panel further comprises a second light adjustment layer disposed on a side of the second substrate facing away from the first substrate, and wherein light passing through the second light adjustment layer is parallel light or scattered light.

7. The display panel according to claim 6, wherein the second light adjustment layer comprises a second edge portion and a second center portion,
light passing through the second edge portion is redirected by the second light adjustment layer to a greater extent than light passing through the second center portion.

8. The display panel according to claim 7, wherein parallel light propagating in a direction perpendicular to the plane of the display panel converges at a point between the first substrate and the second substrate after being emitted from the first light adjustment layer.

9. The display panel according to claim 8, wherein the first light adjustment layer comprises a first convex lens, the second light adjustment layer comprises a second convex lens, the second convex lens does not overlap the light-emitting region, and a projection of the first convex lens on the plane of the display panel covers a projection of the second convex lens on the plane of the display panel.

10. The display panel according to claim 8, wherein the second light adjustment layer has a uniform thickness, and the second light adjustment layer has a refractive index decreasing with an increase in its distance from a center of the light-transmitting region.

11. The display panel according to claim 7, wherein parallel light propagating in a direction perpendicular to the plane of the display panel converges at a point on the side of the second substrate facing away from the first substrate after passing through the first light adjustment layer.

12. The display panel according to claim 11, wherein the first light adjustment layer comprises a first convex lens, the second light adjustment layer comprises a concave lens, the concave lens does not overlap the light-emitting region, and a projection of the first convex lens on the plane of the display panel covers a projection of the concave lens on the plane of the display panel.

13. The display panel according to claim 11, wherein the second light adjustment layer has a uniform thickness, and the second light adjustment layer has a refractive index that increases with an increase in its distance from a center of the light-transmitting region.

14. The display panel according to claim 10, wherein the first light adjustment layer and/or the second light adjustment layer comprise liquid crystals.

15. The display panel according to claim 10, wherein the first light adjustment layer and/or the second light adjustment layer comprise a ferroelectric material.

16. The display panel according to claim 6, wherein the second light adjustment layer comprises a scattering layer, and the scattering layer covers the second substrate.

17. A display device, comprising a display panel, the display panel comprising:
 a display layer comprising a light-transmitting region and a light-emitting region;
 and
 a first light adjustment layer disposed on a first surface of the display layer,
 wherein the light-emitting region comprises a first edge portion and a first center portion, wherein a distance between the first edge portion and the light-transmitting region is smaller than a distance between the first center portion and the light-transmitting region,
 wherein the first light adjustment layer overlaps the light-emitting region and the light-transmitting region, a portion of the first light adjustment layer overlapping the light-emitting region and a portion of the first light adjustment layer overlapping the light-transmitting region have an identical refractive index, and a thickness of the first light adjustment layer decreases with an increase in its distance from a center of the light-transmitting region, so that with respect to light propagating into the display layer via the first surface, at least one portion of the light, which is directed towards the light-emitting region, is redirected by the first light adjustment layer to pass through the light-transmitting region; and with respect to light propagating to the first light adjustment layer in a direction perpendicular to a plane of the display panel, a portion of the light propagating toward the first edge portion is redirected by the first light adjustment layer to a smaller extent than a portion of the light propagating toward the first center portion,
 wherein the thickness of the first light adjustment layer is a thickness in a direction perpendicular to the display panel.

18. The display panel according to claim 4,
 wherein the display layer further comprises: a first substrate; and a second substrate opposite to the first substrate,
 wherein the light-emitting region comprises a plurality of sub-pixels disposed on a side of the first substrate facing the second substrate, the light-transmitting region is located between two adjacent sub-pixels of the plurality of sub-pixels, and the first light adjustment layer is disposed on a side of the first substrate facing away from the second substrate,
 wherein the display panel further comprises a second light adjustment layer disposed on a side of the second substrate facing away from the first substrate, and wherein light passing through the second light adjustment layer is parallel light or scattered light.

19. The display panel according to claim 18, wherein the second light adjustment layer comprises a scattering layer, and the scattering layer covers the second substrate.

20. The display panel according to claim 18, wherein the first light adjustment layer and/or the second light adjustment layer comprise liquid crystals or a ferroelectric material.

* * * * *